United States Patent
Kato et al.

(10) Patent No.: US 9,871,006 B2
(45) Date of Patent: Jan. 16, 2018

(54) SEMICONDUCTOR MODULE HAVING A SOLDER-BONDED COOLING UNIT

(71) Applicant: FUJI ELECTRIC CO., LTD., Kanagawa (JP)

(72) Inventors: Ryoichi Kato, Matsumoto (JP); Takafumi Yamada, Matsumoto (JP); Hiromichi Gohara, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/243,971

(22) Filed: Aug. 23, 2016

(65) Prior Publication Data

US 2016/0358864 A1 Dec. 8, 2016

Related U.S. Application Data

(63) Continuation of application No. PCT/JP2015/070198, filed on Jul. 14, 2015.

(30) Foreign Application Priority Data

Sep. 17, 2014 (JP) .................... 2014-189208

(51) Int. Cl.
| | |
|---|---|
| *H01L 23/367* | (2006.01) |
| *H01L 23/00* | (2006.01) |
| *H01L 23/473* | (2006.01) |
| *H01L 21/48* | (2006.01) |
| *H01L 23/373* | (2006.01) |

(52) U.S. Cl.
CPC ........ *H01L 23/562* (2013.01); *H01L 21/4882* (2013.01); *H01L 23/3672* (2013.01);
(Continued)

(58) Field of Classification Search
CPC ............ H01L 21/4882; H01L 23/3672; H01L 23/3735; H01L 23/473; H01L 23/562;
(Continued)

(56) References Cited

U.S. PATENT DOCUMENTS

| | | |
|---|---|---|
| 2009/0114373 A1 | 5/2009 | Sawaguchi et al. |
| 2010/0170662 A1 | 7/2010 | Baba et al. |
| | (Continued) | |

FOREIGN PATENT DOCUMENTS

| | | |
|---|---|---|
| JP | 2009-135477 A | 6/2009 |
| JP | 2010-171279 A | 8/2010 |
| | (Continued) | |

OTHER PUBLICATIONS

International Search Report for International Application No. PCT/JP2015/070198, issued by the Japan Patent Office dated Oct. 6, 2015.

Office Action issued for counterpart Japanese Application 2016-548609, issued by the Japan Patent Office dated Sep. 5, 2017.

*Primary Examiner* — Jarrett Stark
*Assistant Examiner* — Shahed Ahmed

(57) ABSTRACT

A semiconductor module including an insulated circuit substrate having a substrate, a circuit layer on a front surface of the substrate, and a metal layer on a back surface of the substrate; a semiconductor element electrically connected to the circuit layer; a cooling unit having a ceiling board bonded to the metal layer, a bottom board opposite the ceiling board, a side wall connecting a periphery of the ceiling board and a periphery of the bottom board, and a fin connecting the ceiling board and bottom board, where thickness of the ceiling board is at least 0.5 mm and at most 2.0 mm and total thickness of the ceiling board and bottom board is at least 3 mm and at most 6 mm; and a solder layer that bonds together the metal layer and the ceiling board by melting at a temperature of at least 200° C. and at most 350° C.

8 Claims, 7 Drawing Sheets

(52) U.S. Cl.
CPC ........ *H01L 23/3735* (2013.01); *H01L 23/473* (2013.01); *H01L 24/29* (2013.01); *H01L 24/32* (2013.01); *H01L 2224/291* (2013.01); *H01L 2224/32227* (2013.01)

(58) Field of Classification Search
CPC ........... H01L 2224/32227; H01L 24/29; H01L 24/32; H01L 2224/291
USPC ....... 257/276, 675, 706, 717, 718, 720, 796; 438/122, 612
See application file for complete search history.

(56) References Cited

U.S. PATENT DOCUMENTS

| | | | |
|---|---|---|---|
| 2010/0187680 A1* | 7/2010 | Otsuka | H01L 23/3735 257/706 |
| 2010/0193941 A1* | 8/2010 | Mori | H01L 23/3735 257/712 |
| 2014/0159225 A1 | 6/2014 | Zushi et al. | |
| 2014/0263558 A1* | 9/2014 | Hausen | A61B 17/07207 227/176.1 |
| 2016/0249452 A1* | 8/2016 | Terasaki | B23K 35/3026 |

FOREIGN PATENT DOCUMENTS

| | | |
|---|---|---|
| JP | 2010-251443 A | 11/2010 |
| JP | 2012-38825 A | 2/2012 |
| JP | 2012-142465 A | 7/2012 |
| JP | 2013-045974 A | 3/2013 |

* cited by examiner

| | CEILING BOARD THICKNESS A (mm) | BOTTOM BOARD THICKNESS B (mm) | TOTAL THICKNESS A+B (mm) | B/A RATIO | PLASTIC WARPING AMPLITUDE (%) | CURVATURE AMOUNT (mm) |
|---|---|---|---|---|---|---|
| 1st EMBOD. | 0.5 | 2.5 | 3 | 5 | 1.16 | 0.99 |
| 2nd EMBOD. | 1 | 2 | 3 | 2 | 1.25 | 0.99 |
| 3rd EMBOD. | 1.5 | 1.5 | 3 | 1 | 1.27 | 0.99 |
| 4th EMBOD. | 1 | 3 | 4 | 3 | 1.26 | 0.88 |
| 5th EMBOD. | 1.33 | 2.67 | 4 | 2 | 1.27 | 0.87 |
| 6th EMBOD. | 2 | 2 | 4 | 1 | 1.44 | 0.85 |
| 7th EMBOD. | 0.5 | 5.5 | 6 | 11 | 1.2 | 0.77 |
| 8th EMBOD. | 1 | 5 | 6 | 5 | 1.27 | 0.70 |
| 9th EMBOD. | 1.5 | 4.5 | 6 | 3 | 1.29 | 0.71 |
| 10th EMBOD. | 2 | 4 | 6 | 2 | 1.4 | 0.70 |
| 1st COMPARA. | 1 | 1 | 2 | 1 | 1.24 | 1.13 |
| 2nd COMPARA. | 3 | 3 | 6 | 1 | 1.54 | 0.63 |
| 3rd COMPARA. | 4 | 4 | 8 | 1 | 1.65 | 0.48 |

*FIG. 2*

SEMICONDUCTOR MODULE HAVING A SOLDER-BONDED COOLING UNIT

The contents of the following Japanese and PCT patent applications are incorporated herein by reference:
NO. JP2014-189208 filed on Sep. 17, 2014 and
No. PCT/JP2015/070198 filed on Jul. 14, 2015.

BACKGROUND

1. Technical Field

The present invention relates to a semiconductor module in which a semiconductor unit and a cooling unit are solder-bonded to each other.

2. Related Art

The following Patent Documents are known that relate to deformation of a cooling unit of a semiconductor module.

Patent Document 1 discloses a cooling unit formed from a ceiling board, a bottom board, and a cooling agent flow path section formed between the ceiling board and the flow board. A substrate on which the heat generating body is mounted is bonded to the top surface of the ceiling board via brazing. In this cooling unit, the ceiling board has a recessed portion in which is formed a bonding surface to which the substrate is bonded, and the thickness ratio of the ceiling board to the bottom board is from 1:3 to 1:10.

Patent Document 2 discloses a heat releasing device that includes an insulated substrate having a semiconductor chip, which is the heat generating body, arranged on the front surface thereof, and a heat sink that releases the heat of the semiconductor chip and is provided on the back surface of the insulated substrate with a stress reducing member containing a stress absorbing space interposed therebetween. The heat releasing device is formed by bonding together the insulated substrate, the stress reducing member, and the heat sink via brazing. In this heat releasing device, the heat sink includes a ceiling board bonded to the stress reducing member and a bottom board that is bonded to the ceiling board and forms a flow path for a cooling fluid between itself and the ceiling board. In this heat releasing device, the thickness ratio of the ceiling board to the bottom board is in a range from 1:3 to 1:5. The heat sink includes a fin provided in the flow path of the cooling fluid to connect the ceiling board and the bottom board, the fin is bonded to ceiling board and the bottom board using vacuum brazing, and the thickness of the ceiling board is 0.8 mm.

Patent Document 3 discloses a cooling unit of a power module, in which a casing including a water path for cooling water therein is formed by combining a plurality of aluminum members. This cooling unit is formed such that the thickness ratio of a ceiling board to a bottom board of the casing is from 1:5 to 1:10. A high-purity aluminum block is secured to the ceiling board in order to secure the power module, a frame-shaped protrusion or groove is formed in the ceiling board at a position surrounding the high-purity aluminum block, and the water path is divided into a plurality of parallel flow paths by a plurality of cooling fins extending in a direction orthogonal to the longitudinal direction of the insulated substrate of the power module.

Patent Document 4 discloses a semiconductor device in which a cooling device and a metal plate exposed in a semiconductor module are bonded to each other by a bonding agent. In this semiconductor device, a recessed portion is formed in the surface bonded by the bonding agent, in a region around the bond corresponding to a region around the portion bonded to the metal plate.

Patent Document 1: Japanese Patent Application Publication No. 2010-251443
Patent Document 2: Japanese Patent Application Publication No. 2010-171279
Patent Document 3: Japanese Patent Application Publication No. 2008-288495
Patent Document 4: Japanese Patent Application Publication No. 2012-142465

In Patent Document 1 and Patent Document 2, the substrate is bonded to the cooling unit by brazing. Brazing is performed at approximately 600° C., and therefore there is more warping when the normal temperature is reached after the bonding compared to a case, such as in this application, where solder that melts at a temperature from approximately 200° C. to 350° C. that is lower than the brazing temperature is used. Accordingly, Patent Document 1 and Patent Document 2 are not suitable for a semiconductor module in which a semiconductor unit and a cooling unit are bonded by soldering.

In Patent Document 3 and Patent Document 4, a frame-shaped protrusion or groove is formed in the ceiling board, and therefore there is a problem that the machining cost is increased.

SUMMARY

Therefore, it is an object of an aspect of the innovations herein to provide a semiconductor module that uses solder to bond together a semiconductor unit and a cooling unit, in which the plastic warping amplitude of the solder and the curvature of the cooling unit are both reduced. The above and other objects can be achieved by combinations described in the claims.

BRIEF DESCRIPTION OF THE DRAWINGS

FIG. 2 shows a list of simulation results for first to third comparative examples and first to tenth embodiment examples of the semiconductor module according to the first embodiment of the present invention.

DESCRIPTION OF EXEMPLARY EMBODIMENTS

Figure 1:
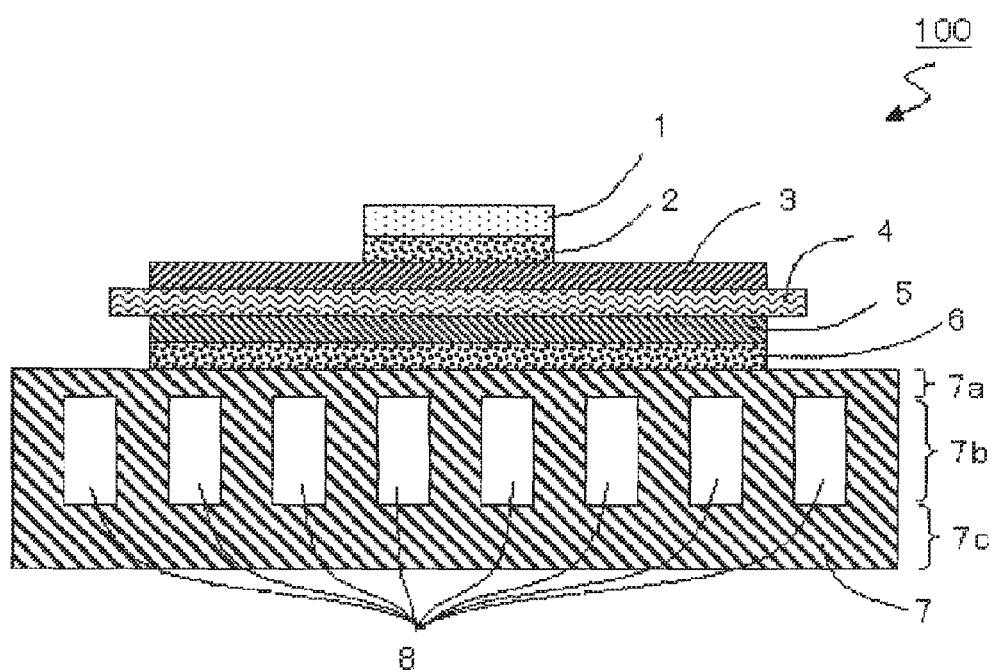
FIG. 1 is a cross-sectional view of a semiconductor module according to a first embodiment of the present invention.

According to a first aspect of the present invention, provided is a semiconductor module. The semiconductor module may comprise an insulated circuit substrate. The insulated circuit substrate may include a circuit layer arranged on a front surface of a substrate. The insulated circuit substrate may include a metal layer arranged on a back surface of the substrate. The semiconductor module may comprise a semiconductor element. The semiconductor element may be electrically connected to the circuit layer. The semiconductor module may comprise a cooling unit. The cooling unit may include a ceiling board. The ceiling board may have a flat surface bonded to the metal layer. The cooling unit may include a bottom board. The bottom board may be arranged opposite the ceiling board. The cooling unit may include a side wall. The side wall may connect a periphery of the ceiling board and a periphery of the bottom board. The cooling unit may include a fin. The fin may connect the ceiling board and the bottom board. The thickness of the ceiling board may be greater than or equal to 0.5 mm and less than or equal to 2.0 mm. A total thickness of the ceiling board and the bottom board may be greater than or equal to 3 mm and less than or equal to 6 mm. The semiconductor module may comprise a solder layer. The solder layer may be melted at a temperature greater than or equal to 200° C. and less than or equal to 350° C. The solder layer may bond together the metal layer and the ceiling board.

When the thickness of the ceiling board is less than 0.5 mm, there is a problem that the ceiling board deforms easily or breaks during manufacturing of the module. Furthermore, if the thickness of the ceiling board exceeds 2.0 mm, the plastic warping amplitude of the solder increases.

If the total thickness of the ceiling board and the bottom board is less than 3 mm, there is a problem that the curvature amount of the cooling unit increases, and if this total thickness is greater than 6 mm, there is a problem that the manufacturing cost increases.

If the melting point of the solder used in the solder layer is less than 200° C., the solder becomes difficult to melt, and if this melting point is greater than 350° C., the furnace temperature used during manufacturing must be increased, which increases the manufacturing cost.

Since the solder layer is melted at a temperature greater than or equal to 200° C. and less than or equal to 350° C. to bond the ceiling board and the metal layer, compared to a case where brazing is used to bond the ceiling board and the metal layer, there is less warping when the solder layer has returned to room temperature after the bonding. Therefore, even when the total thickness of the ceiling board and the bottom board is small, it is possible to reduce the curvature amount of the cooling unit. Accordingly, with this structure, in the semiconductor module using the solder layer to bond the ceiling board and the metal layer, it is possible to decrease the plastic warping amplitude of the solder and the curvature amount of the cooling unit. Since the thermal transfer resistance of the ceiling board decreases when the ceiling board is thinner, the cooling performance of the semiconductor unit can be improved. Furthermore, when the bottom board is thinner, the weight of the cooling unit can be decreased.

In the semiconductor module described above, the total thickness of the ceiling board and the bottom board is more preferably greater than or equal to 3 mm and less than or equal to 4 mm. If the upper limit of the total thickness of the ceiling board and the bottom board is less than or equal to 4 mm, the weight of the cooling unit can be decreased.

In the semiconductor module described above, the bottom board is preferably thicker than the ceiling board. Specifically, the thickness of the bottom board is preferably greater than or equal to the thickness of the ceiling board and less than or equal to five times the thickness of the ceiling board. The thickness of the bottom board is greater than or equal to two times the thickness of the ceiling board and less than three times the thickness of the ceiling board.

With this structure, the ceiling board is thinner than the bottom board, and therefore the heat generated by the semiconductor element can be more easily transferred to the ceiling board of the cooling unit and the efficiency of the heat transfer to the cooling medium from the semiconductor element via the ceiling board can be improved.

In the semiconductor module described above, the material of the cooling unit is aluminum or an aluminum alloy. The cooling unit in the semiconductor module described above can adopt at least two types of structural variation. A first cooling unit is formed by integrally molding the ceiling board, the bottom board, the side wall, and the fin through press molding.

With this structure, the first cooling unit is molded integrally, and therefore the assembly cost can be reduced.

A second cooling unit is formed by integrally bonding a composite member that is the bottom board and the side wall formed integrally, the ceiling board, and the fin with the bonding member.

With the second cooling unit, compared to the first cooling unit that is press molded, the manufacturing cost of the components can be reduced.

The summary clause does not necessarily describe all necessary features of the embodiments of the present invention. The present invention may also be a sub-combination of the features described above.

According to an aspect of the present invention, provided is a semiconductor module that uses solder to bond together a semiconductor unit and a cooling unit, in which the plastic warping amplitude of the solder and the curvature of the cooling unit are both reduced.

Hereinafter, some embodiments of the semiconductor module according to the present invention will be described. Identical structural components are given the same reference numerals, and redundant descriptions are omitted. The embodiments do not limit the invention according to the claims, and all the combinations of the features described in the embodiments are not necessarily essential to means provided by aspects of the invention.

FIG. 1 is a cross-sectional view of a semiconductor module according to a first embodiment of the present invention. The semiconductor module 100 according to the first embodiment of the present invention includes a semiconductor element 1, a solder layer 2, a circuit layer 3, an insulated substrate 4, a metal layer 5, a solder layer 6, and a first cooling unit 7. The first cooling unit 7 includes a ceiling board 7a, a plurality of fins 7b, and a bottom board 7c formed integrally.

The ceiling board 7a may have a uniform thickness. The bottom board 7c is arranged opposite the ceiling board 7a. The surfaces of the ceiling board 7a and the bottom board 7c facing each other may have the same shape. The bottom board 7c may have a uniform thickness.

The plurality of fins 7b are provided between the ceiling board 7a and the bottom board 7c, and connect the ceiling board 7a and the bottom board 7c. Among the plurality of fins 7b, the fins 7b formed farthest outward serve as side walls. The fins 7b formed farthest outward connect the periphery of the ceiling board 7a and the periphery of the bottom board 7c. The plurality of fins 7b may be arranged at uniform intervals.

Between each pair of left-right adjacent fins 7b, a cavity 8 is formed that is surrounded by the ceiling board 7a, the left-right adjacent fins 7b, and the bottom board 7c, and the cooling medium flows through the cavities 8. The material of the first cooling unit 7 is aluminum. In the first to tenth embodiment examples and first to third comparative examples described below, a semiconductor module having the structure shown in FIG. 1 is used in a simulation. The calculations are performed assuming that the material of the first cooling unit 7 is aluminum.

First Embodiment Example

A simulation was performed with the thickness A of the ceiling board set to 0.5 mm and the thickness B of the bottom board set to 2.5 mm. The total thickness of A and B is 3 mm, and the B/A ratio is 5. The calculation results indicate that the plastic warping amplitude of the solder was 1.16% and the curvature amount of the cooling unit was 0.99 mm.

Second Embodiment Example

A simulation was performed with the thickness A of the ceiling board set to 1 mm and the thickness B of the bottom board set to 2 mm. The total thickness of A and B is 3 mm, and the B/A ratio is 2. The calculation results indicate that the plastic warping amplitude of the solder was 1.25% and the curvature amount of the cooling unit was 0.99 mm.

Third Embodiment Example

A simulation was performed with the thickness A of the ceiling board set to 1.5 mm and the thickness B of the bottom board set to 1.5 mm. The total thickness of A and B is 3 mm, and the B/A ratio is 1. The calculation results indicate that the plastic warping amplitude of the solder was 1.27% and the curvature amount of the cooling unit was 0.99 mm.

Fourth Embodiment Example

A simulation was performed with the thickness A of the ceiling board set to 1 mm and the thickness B of the bottom board set to 3 mm. The total thickness of A and B is 4 mm, and the B/A ratio is 3. The calculation results indicate that the plastic warping amplitude of the solder was 1.26% and the curvature amount of the cooling unit was 0.88 mm.

Fifth Embodiment Example

A simulation was performed with the thickness A of the ceiling board set to 1.33 mm and the thickness B of the bottom board set to 2.67 mm. The total thickness of A and B is 4 mm, and the B/A ratio is 2. The calculation results indicate that the plastic warping amplitude of the solder was 1.27% and the curvature amount of the cooling unit was 0.87 mm.

Sixth Embodiment Example

A simulation was performed with the thickness A of the ceiling board set to 2 mm and the thickness B of the bottom board set to 2 mm. The total thickness of A and B is 4 mm, and the B/A ratio is 1. The calculation results indicate that the plastic warping amplitude of the solder was 1.44% and the curvature amount of the cooling unit was 0.85 mm.

Seventh Embodiment Example

A simulation was performed with the thickness A of the ceiling board set to 0.5 mm and the thickness B of the bottom board set to 5.5 mm. The total thickness of A and B is 6 mm, and the B/A ratio is 11. The calculation results indicate that the plastic warping amplitude of the solder was 1.2% and the curvature amount of the cooling unit was 0.77 mm.

Eighth Embodiment Example

A simulation was performed with the thickness A of the ceiling board set to 1 mm and the thickness B of the bottom board set to 5 mm. The total thickness of A and B is 6 mm, and the B/A ratio is 5. The calculation results indicate that the plastic warping amplitude of the solder was 1.27% and the curvature amount of the cooling unit was 0.70 mm.

Ninth Embodiment Example

A simulation was performed with the thickness A of the ceiling board set to 1.5 mm and the thickness B of the bottom board set to 4.5 mm. The total thickness of A and B is 6 mm, and the B/A ratio is 3. The calculation results indicate that the plastic warping amplitude of the solder was 1.29% and the curvature amount of the cooling unit was 0.71 mm.

Tenth Embodiment Example

A simulation was performed with the thickness A of the ceiling board set to 2 mm and the thickness B of the bottom board set to 4 mm. The total thickness of A and B is 6 mm, and the B/A ratio is 2. The calculation results indicate that the plastic warping amplitude of the solder was 1.4% and the curvature amount of the cooling unit was 0.70 mm.

First Comparative Example

A simulation was performed with the thickness A of the ceiling board set to 1 mm and the thickness B of the bottom board set to 1 mm. The total thickness of A and B is 2 mm, and the B/A ratio is 1. The calculation results indicate that the plastic warping amplitude of the solder was 1.24% and the curvature amount of the cooling unit was 1.13 mm.

Second Comparative Example

A simulation was performed with the thickness A of the ceiling board set to 3 mm and the thickness B of the bottom board set to 3 mm. The total thickness of A and B is 6 mm, and the B/A ratio is 1. The calculation results indicate that the plastic warping amplitude of the solder was 1.54% and the curvature amount of the cooling unit was 0.63 mm.

Third Comparative Example

A simulation was performed with the thickness A of the ceiling board set to 4 mm and the thickness B of the bottom board set to 4 mm. The total thickness of A and B is 8 mm, and the B/A ratio is 1. The calculation results indicate that the plastic warping amplitude of the solder was 1.65% and the curvature amount of the cooling unit was 0.48 mm.

(Analysis of the Simulation Results)

Figure 3:
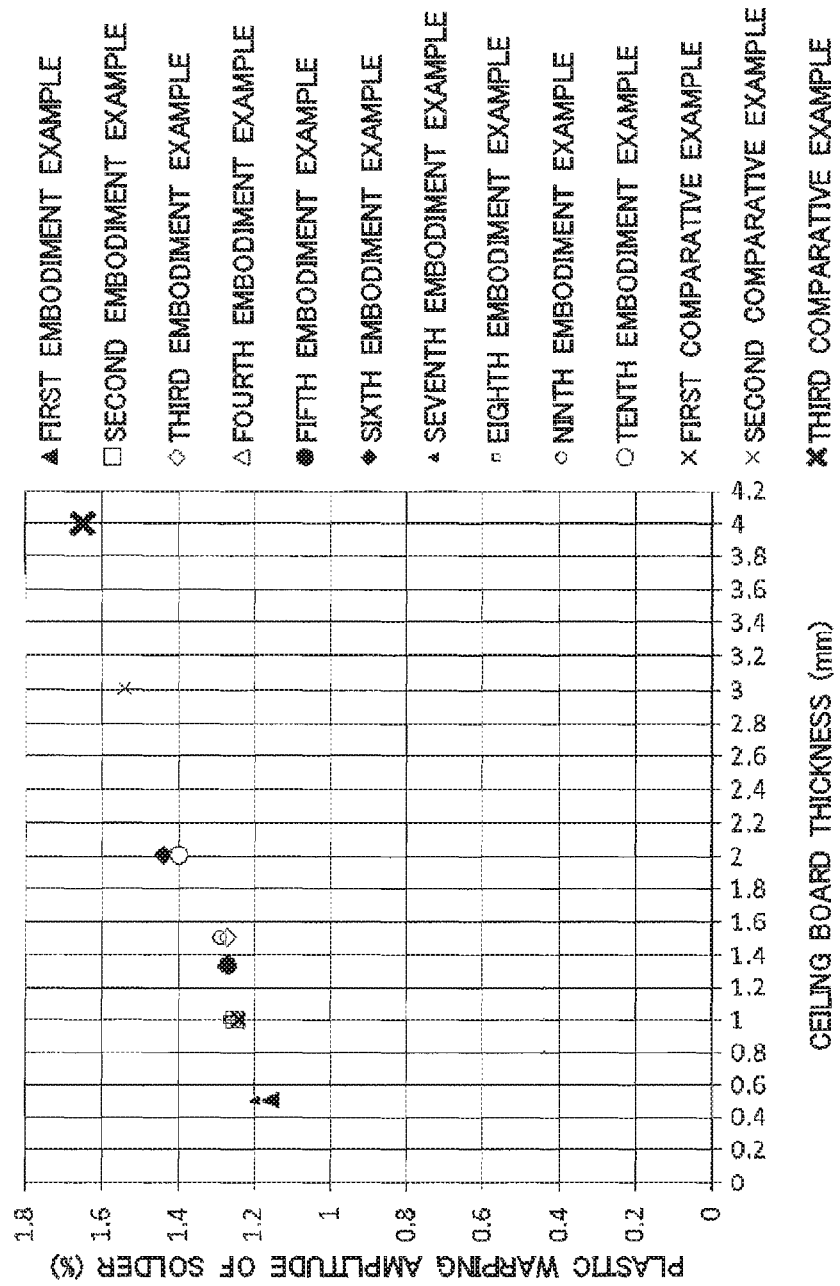
FIG. 3 is a chart showing the relationship between the thickness of the ceiling board and the plastic warping amplitude (%) of the solder, from the results of FIG. 2.
Figure 4:
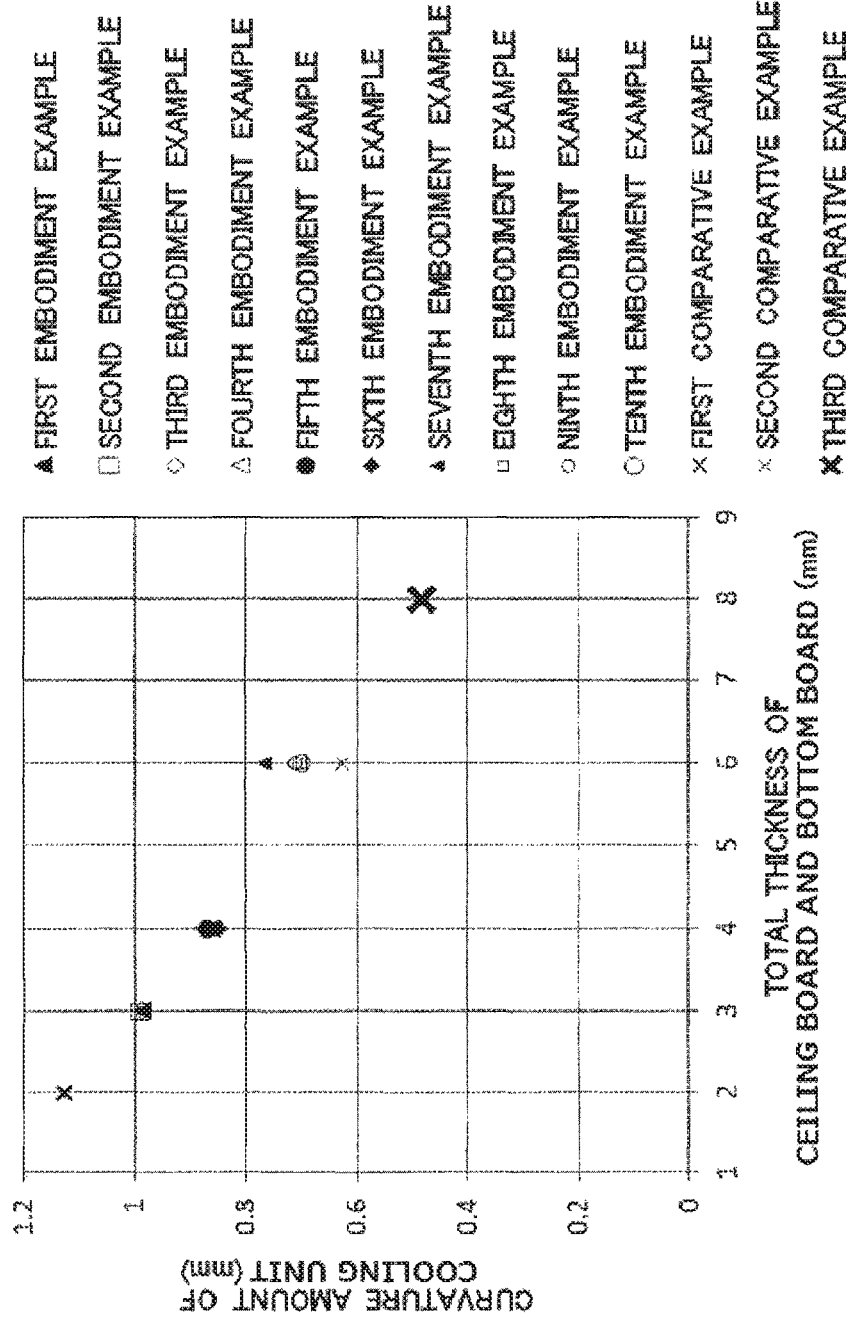
FIG. 4 is a chart showing the relationship between the total thickness of the ceiling board and bottom board and the curvature amount (mm) of the cooling unit, from the results of FIG. 2.
Figure 6:
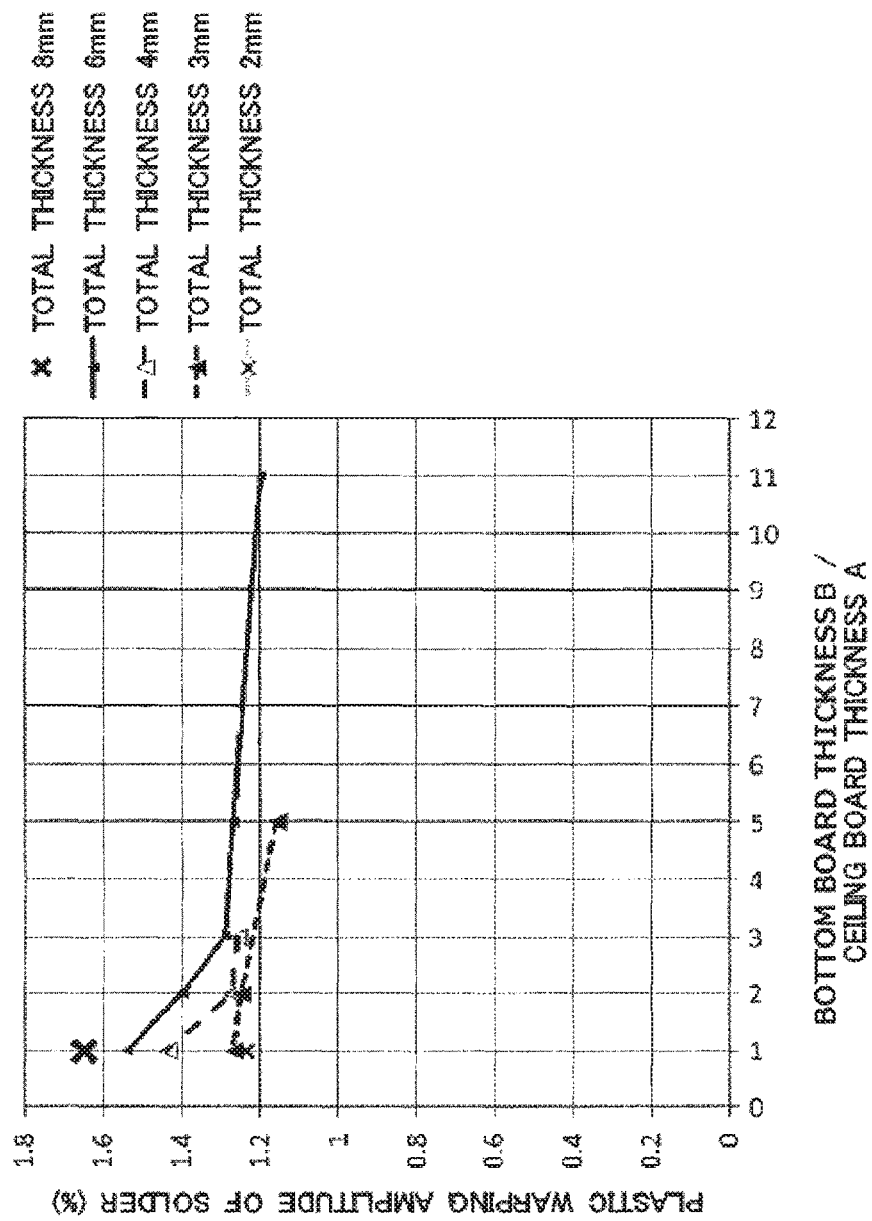
FIG. 6 is a graph showing the plastic warping amplitude of the solder with respect to the ratio (B/A ratio) of the thickness (B) of the bottom board to each thickness (A) of the ceiling board.
Figure 7:
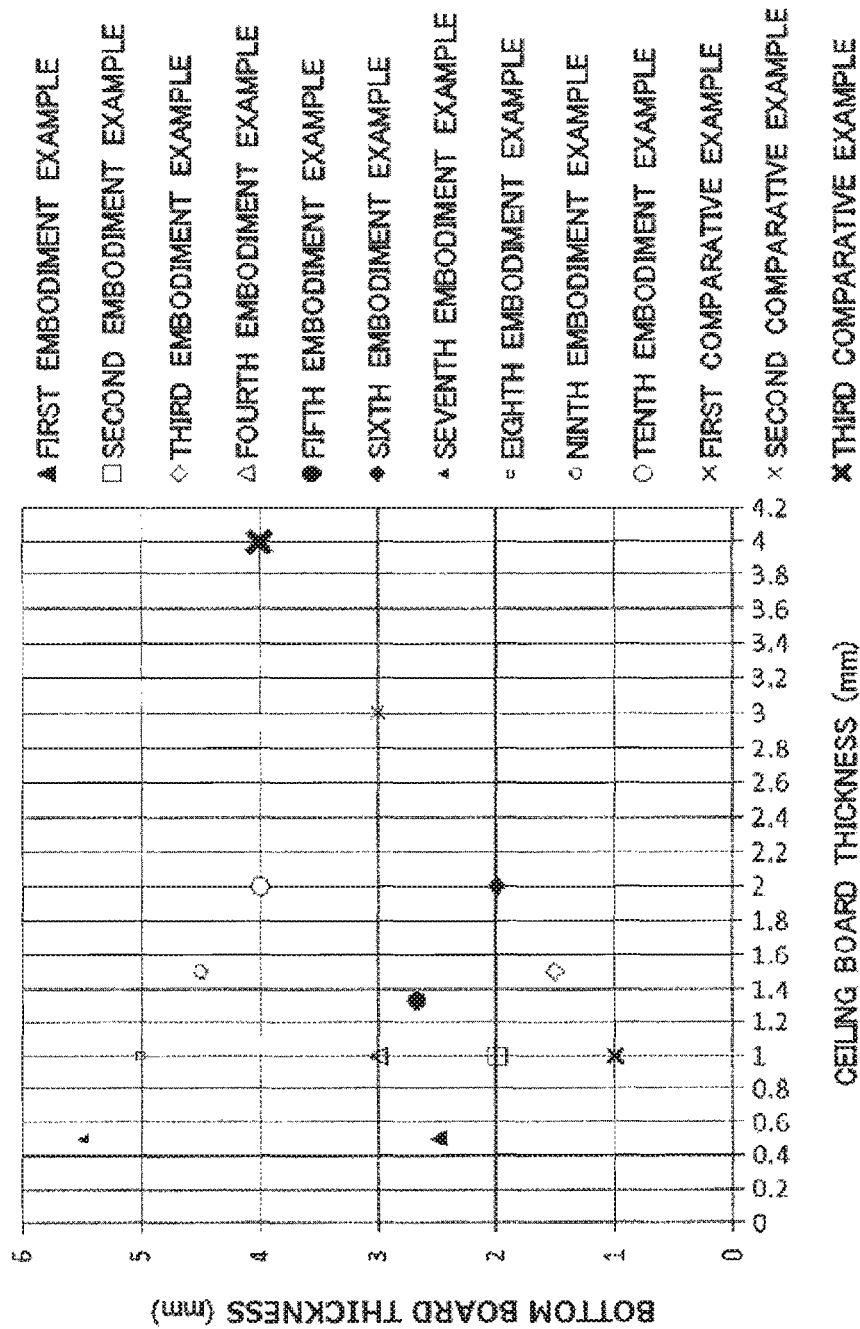
FIG. 7 is a chart showing the distribution of conditions shown in FIG. 2.

The simulation results are shown in FIG. 2. FIG. 7 shows the distribution of conditions in FIG. 2. FIGS. 3 and 4 show graphs of the results seen in FIG. 2. FIG. 6 is a graph showing the plastic warping amplitude of the solder with respect to the ratio (B/A ratio) of the thickness (B) of the bottom board to each thickness (A) of the ceiling board.

As shown in FIG. 3, the thickness of the ceiling board had a correlative relationship with the plastic warping amplitude of the solder. FIG. 3 shows that, when the thickness of the ceiling board is smaller, the plastic warping amplitude of the solder is lower.

As shown in FIG. 4, the total thickness of the ceiling board and the bottom board had a correlative relationship with the curvature amount of the cooling unit. FIG. 4 shows that, when the total thickness of the ceiling board and the bottom board is larger, the curvature amount of the cooling unit is smaller.

FIG. 6 shows that, for every total thickness of the ceiling board and the bottom board, the larger the ratio (B/A ratio) of the thickness (B) of the bottom board to each thickness (A) of the ceiling board beyond a value of 1, the lower the plastic warping amplitude of the solder. The thickness of the bottom board is preferably greater than or equal to the thickness of the ceiling board and less than or equal to five times the thickness of the ceiling board, more preferably greater than or equal to two times the thickness of the ceiling board and less than or equal to three times the thickness of the ceiling board. This is because, when the thickness (A) is less than two times the thickness (B), the value of the plastic warping amplitude of the solder still tends to be high, and when the thickness (A) is greater than or equal to three times or exceeds five times the thickness (B), the effect of reducing the plastic warping amplitude of the solder becomes weaker.

For the first comparative example, in which the thickness of the ceiling board is 1 mm and the total thickness of the ceiling board and the bottom board is 2 mm, in FIG. 3, if the allowable upper limit for the plastic warping amplitude of the solder is 1.5%, then the plastic warping amplitude of this first comparative example is within the allowable range. However, in this first comparative example, in FIG. 4, if the allowable upper limit for the curvature amount of the cooling unit is 1 mm, then there is a problem that the curvature amount of this first comparative example exceeds the allowable upper limit.

When the B/A ratio is set to 1 and the total thickness of the ceiling board and the bottom board is increased, as in the second and third comparative examples, the curvature amount is within the allowable range, but there is a problem that the plastic warping amplitude exceeds the allowable upper limit.

In order for both the plastic warping amplitude of the solder and the curvature amount of the cooling unit to be within their respective allowable ranges, the thickness of the ceiling board must be less than or equal to 2 mm and the total thickness of the ceiling board and the bottom board must be greater than or equal to 3 mm. In order to further reduce the plastic warping amplitude of the solder, the ceiling board is preferably made thinner, but manufacturing difficulties occur if this thickness is less than 0.5 mm, and therefore the lower limit for this thickness is preferably at least 0.5 mm. In order to further reduce the curvature amount, the total thickness of the ceiling board and the bottom board is preferably made greater, but a greater total thickness causes higher manufacturing costs, and therefore the total thickness of the ceiling board and the bottom board is most preferably reduced while still keeping the curvature amount within the allowable range.

The present invention is an invention limited to a semiconductor module that includes a solder layer bonding a ceiling board and a metal layer by melting at a temperature greater than or equal to 200° C. and less than or equal to 350° C. There are examples of metal layers using materials that can be melted through brazing at higher temperatures than this, but when the semiconductor module is exposed to even higher temperatures, there is a problem that the plastic warping amplitude of the solder and the curvature amount of the cooling unit increase.

Accordingly, the semiconductor module of the present invention preferably includes a cooling unit in which the thickness of the ceiling board is greater than or equal to 0.5 mm and less than or equal to 2.0 mm and the total thickness of the ceiling board and the bottom board is greater than or equal to 3 mm and less than or equal to 6 mm, and a solder layer that bonds the ceiling board and the metal layer by melting at a temperature greater than or equal to 200° C. and less than or equal to 350° C.

Figure 5:
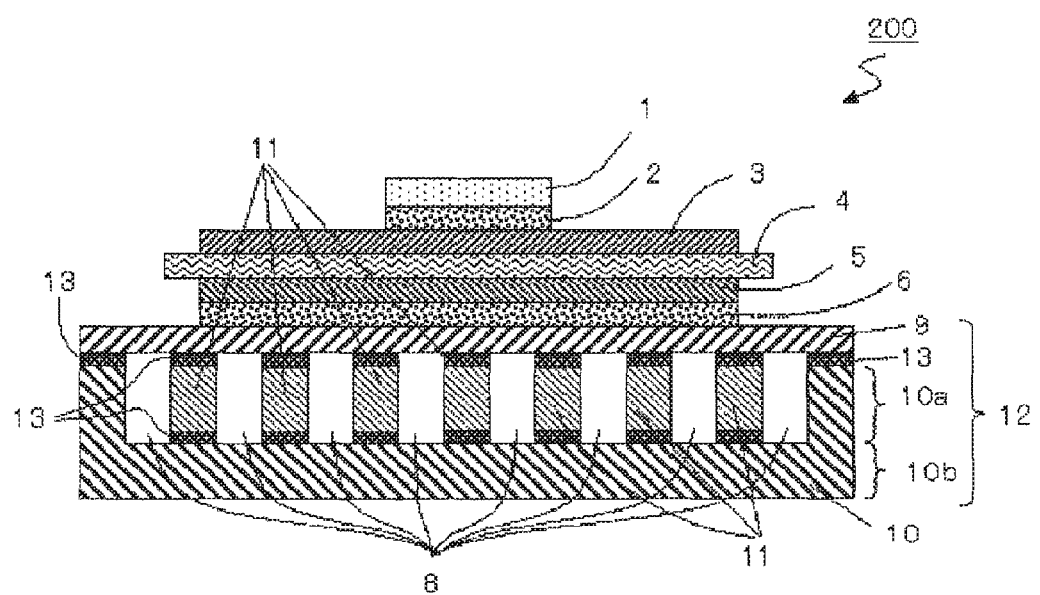
FIG. 5 is a cross-sectional view of a semiconductor module according to a second embodiment of the present invention.

FIG. 5 is a cross-sectional view of a semiconductor module according to a second embodiment of the present invention. The semiconductor module 200 according to the second embodiment of the present invention includes a semiconductor element 1, a solder layer 2, a circuit layer 3, an insulated substrate 4, a metal layer 5, a solder layer 6, a cavity 8, a ceiling board 9, a jacket 10, a fin 11, and a bonding member 13. The jacket 10 is formed by at least a side wall 10a and a bottom board 10b. As shown in FIG. 5, instead of the cooling unit 7 of the structure shown in FIG. 1, a second cooling unit 12 may be used in which the ceiling board 9, the jacket 10, and the fins 11 of the second cooling unit 12 are separated from each other and bonded together with bonding members 13. The bonding members 13 are arranged between the top ends of the fins 11 and the ceiling board 9, between the bottom ends of the fins 11 and the bottom board 10b of the jacket 10, and between the ceiling board 9 and the top ends of the side walls 10a of the jacket 10. The bonding members 13 are not particularly limited as long as they can be melted at the same temperature as the melted solder layer 6, but as an example, the same composition as that of the solder layer 6 may be used. With the structure of the semiconductor module 200 as well, in the same manner as the semiconductor module 100 shown in FIG. 1, the same trends are seen in the relationship between the thickness of the ceiling board and the plastic warping amplitude of the solder and in the relationship between the total thickness of the ceiling board and the bottom board and the curvature amount of the cooling unit.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

Based on the effect described above, by suitably selecting the thickness of the ceiling board and the total thickness of the ceiling board and the bottom board, it is possible to provide a semiconductor module in which the plastic warping amplitude of the solder and the curvature amount of the cooling unit are both reduced.

What is claimed is:

1. A semiconductor module comprising:
   an insulated circuit substrate that includes a substrate, a circuit layer arranged on a front surface of the substrate, and a metal layer arranged on a back surface of the substrate;
   a semiconductor element that is electrically connected to the circuit layer;
   a cooling unit that includes a ceiling board with a uniform thickness and a flat surface bonded to the metal layer, a bottom board arranged opposite the ceiling board, a side wall that connects a periphery of the ceiling board and a periphery of the bottom board, and a fin that connects the ceiling board and the bottom board, where the thickness of the ceiling board is greater than or equal to 0.5 mm and less than or equal to 2.0 mm and a total thickness of the ceiling board and the bottom board is greater than or equal to 3 mm and less than or equal to 4 mm; and a solder bonding layer that bonds an entire back surface of the metal layer to the ceiling board, the solder bonding layer having a functional melt temperature of less than or equal to 350° C., said solder bonding layer not melting below 200° C.;

wherein a thickness of the bottom board is greater than or equal to two times the thickness of the ceiling board and less than three times the thickness of the ceiling board.

2. The semiconductor module according to claim 1, wherein
the bottom board is thicker than the ceiling board.

3. The semiconductor module according to claim 1, wherein
thickness of the bottom board is greater than or equal to the thickness of the ceiling board and less than or equal to five times the thickness of the ceiling board.

4. The semiconductor module according to claim 1, wherein
the side wall is formed integrally with the bottom board, and
the semiconductor module further comprises bonding members that connect the ceiling board and the side wall, connect the ceiling board and the fin, connect the bottom board and the fin, and enter a melted state at the same temperature as the solder layer.

5. The semiconductor module according to claim 1, wherein
material of the ceiling board and the bottom board is aluminum or an aluminum alloy.

6. The semiconductor module according to claim 5, wherein
the cooling unit is formed by integrally molding the ceiling board, the bottom board, the side wall, and the fin.

7. The semiconductor module according to claim 5, wherein
the cooling unit is formed by integrally bonding a composite member that is the bottom board and the side wall formed integrally, the ceiling board, and the fin with a bonding member.

8. The semiconductor module according to claim 4, wherein the bonding members and the solder bonding layer have a same composition.

\* \* \* \* \*